(12) United States Patent
Kim et al.

(10) Patent No.: US 9,748,481 B2
(45) Date of Patent: Aug. 29, 2017

(54) SEMICONDUCTOR DEVICE INCLUDING A RESISTIVE MEMORY LAYER AND METHOD OF MANUFACTURING THE SAME INCLUDING THE CLEANING OF BYPRODUCTS

(71) Applicant: SK hynix Inc., Gyeonggi-do (KR)

(72) Inventors: Gyu Hyun Kim, Gyeonggi-do (KR);
Dae Won Kim, Gyeonggi-do (KR);
Byoung Ki Lee, Gyeonggi-do (KR);
Han Woo Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/883,216

(22) Filed: Oct. 14, 2015

(65) Prior Publication Data
US 2016/0359111 A1    Dec. 8, 2016

(30) Foreign Application Priority Data

Jun. 8, 2015    (KR) .................... 10-2015-0080657

(51) Int. Cl.
*H01L 45/00* (2006.01)

(52) U.S. Cl.
CPC .......... *H01L 45/1675* (2013.01); *H01L 45/06* (2013.01); *H01L 45/1233* (2013.01); *H01L 45/1253* (2013.01); *H01L 45/144* (2013.01); *H01L 45/16* (2013.01)

(58) Field of Classification Search
None
See application file for complete search history.

(56) References Cited

U.S. PATENT DOCUMENTS

| | | | | |
|---|---|---|---|---|
| 2002/0058197 A1* | 5/2002 | Nozaki | ................. | G03F 7/0046 430/270.1 |
| 2002/0061654 A1* | 5/2002 | Kanegae | ........... | H01L 21/31053 438/710 |
| 2004/0173570 A1* | 9/2004 | Ying | ...................... | B82Y 10/00 216/63 |
| 2009/0194801 A1* | 8/2009 | Celii | ................. | H01L 27/11507 257/295 |
| 2013/0149499 A1* | 6/2013 | Lee | ........................ | H01L 43/12 428/156 |

FOREIGN PATENT DOCUMENTS

KR    1020110009545    1/2011

\* cited by examiner

*Primary Examiner* — Jay C Chang
(74) *Attorney, Agent, or Firm* — IP & T Group LLP

(57) ABSTRACT

A method of semiconductor device fabrication that includes sequentially forming an interfacial conductive layer and an etch stop layer on a resistive memory layer; forming a main conductive layer on the etch stop layer; exposing a portion of the etch stop layer by patterning the main conductive layer; exposing a portion of the interfacial conductive layer by patterning the portion of the etch stop layer; forming an upper electrode structure by patterning the portion of the interfacial conductive layer; cleaning a surface of the upper electrode structure and an exposed surface of the resistive memory layer; and patterning the resistive memory layer using the upper electrode structure as an etch mask.

22 Claims, 10 Drawing Sheets

SEMICONDUCTOR DEVICE INCLUDING A RESISTIVE MEMORY LAYER AND METHOD OF MANUFACTURING THE SAME INCLUDING THE CLEANING OF BYPRODUCTS

CROSS-REFERENCES TO RELATED APPLICATION

The present application claims priority under 35 U.S.C. §119(a) to Korean application number 10-2015-0080657, filed on Jun. 8, 2015, in the Korean Intellectual Property Office, which is incorporated herein by reference in its entirety.

BACKGROUND

1. Technical Field

Various embodiments generally relate to a semiconductor device and a method of manufacturing the same and, more particularly, to a semiconductor device including a resistive memory layer and a method of manufacturing the semiconductor device.

2. Related Art

Increasing semiconductor device integration requires maximizing the number of memory cells in a limited amount of substrate area. One method of accomplishing this is constructing vertical transistors having vertical channels. Variable resistive memory devices having resistive memory layers use vertical transistors as access elements. The resistive memory layer is located over the vertical transistors.

Operational characteristics of memory cells in a variable resistive memory device are dependent on memory cell dimensions. Thus, memory cell uniformity, and especially resistive memory layer uniformity, is required to produce high quality memory devices.

SUMMARY

According to exemplary embodiments, there is provided a method of manufacturing a semiconductor device. The method may include: sequentially forming an interfacial conductive layer and an etch stop layer on a resistive memory layer; forming a main conductive layer on the etch stop layer; exposing a portion of the etch stop layer by patterning the main conductive layer; exposing a portion of the interfacial conductive layer by patterning the portion of the etch stop layer; forming an upper electrode structure by patterning the portion of the interfacial conductive layer; cleaning a surface of the upper electrode structure and an exposed surface of the resistive memory layer; and patterning the resistive memory layer using the upper electrode structure as an etch mask.

According to exemplary embodiments, there is provided a method of manufacturing a semiconductor device. The method may include: forming a resistive memory layer on a lower electrode; forming a barrier layer, which includes an interfacial conductive layer and an etch stop layer, on the resistive memory layer; forming a conductive layer on the barrier layer; forming an upper electrode by patterning the conductive layer until the etch stop layer is exposed; forming an etch stop layer pattern by patterning the etch stop layer using the upper electrode as an etch mask; forming a barrier layer pattern including an interfacial conductive layer pattern and an etch stop layer pattern by removing an exposed portion of the interfacial conductive layer; and forming a resistive memory layer pattern by etching the resistive memory layer using the upper electrode and the barrier layer pattern as etch masks. At that time, a conductive adhesive layer may be further interposed between the carbon layer and the main conductive layer.

According to exemplary embodiments, there is provided a semiconductor device. The semiconductor device may include a lower electrode, a resistive memory layer and an upper electrode. The resistive memory layer may be formed on the lower electrode. The upper electrode may be formed on the resistive memory layer. The upper electrode may include a conductive layer, a carbon layer and a main conductive layer sequentially stacked.

According to exemplary embodiments, there may be provided a semiconductor device. The semiconductor device may include a lower electrode, a resistive memory layer, an upper electrode and a barrier layer. The resistive memory layer may be formed on the lower electrode. The upper electrode may be formed on the resistive memory layer. The barrier layer may be interposed between the resistive memory layer and the upper electrode. The barrier layer may include a first: conductive layer, a carbon layer and a second conductive layer.

BRIEF DESCRIPTION OF THE DRAWINGS

Exemplary embodiments can be understood in more detail from the following detailed description taken in conjunction with the accompanying drawings.

FIGS. 1 to 12 are cross-sectional views illustrating a method of manufacturing a semiconductor device in accordance with exemplary embodiments;

FIG. 13 is a cross-sectional view illustrating a semiconductor device including a resistive memory layer in accordance with exemplary embodiments;

FIGS. 14 and 15 are perspective views illustrating a semiconductor device including a resistive memory layer in accordance with exemplary embodiments;

FIG. 16 is a cross-sectional view illustrating a semiconductor device including a resistive memory layer in accordance with exemplary embodiments;

FIG. 17 is a block diagram illustrating a microprocessor in accordance with exemplary embodiments;

FIG. 18 is a block diagram illustrating a processor in accordance with exemplary embodiments; and FIG. 19 is a block diagram illustrating a system in accordance with exemplary embodiments.

DETAILED DESCRIPTION

Figure 1:
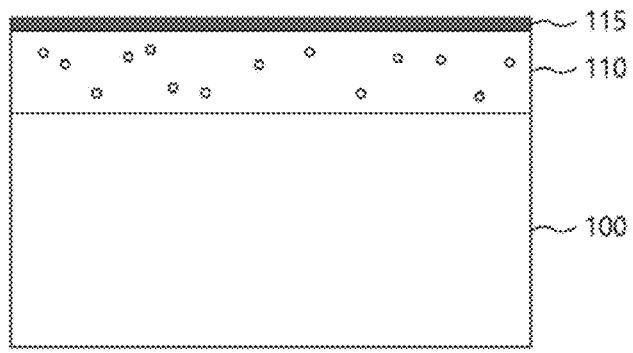
FIGS. 1 to 19 represent non-limiting, exemplary embodiments as described herein.

Various exemplary embodiments will be described more fully hereinafter with reference to the accompanying drawings, in which some exemplary embodiments are shown. The present invention may, however, be embodied in many different forms and should not be construed as limited to the exemplary embodiments set forth herein. Rather, these exemplary embodiments are provided so that this disclosure will be thorough and complete, and will fully convey the scope of the present invention to those skilled in the art. In the drawings, the sizes and relative sizes of parts and thicknesses of layers may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, are used herein to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be oriented otherwise (e.g. rotated 90 degrees or at other orientations) and the spatially relative descriptors used herein interpreted accordingly.

The terminology used herein is for describing particular exemplary embodiments only and is not intended to limit the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than an abrupt change from implanted to non-implanted region. Likewise, a buried region formed by implantation may result in the region between the buried region and the surface through which the implantation takes place. Thus, the regions illustrated in the figures are schematic in nature and their shapes are not intended to illustrate the actual shapes of regions of a device and are not intended to limit the scope of the present invention.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly defined herein.

Hereinafter, exemplary embodiments will be explained in detail with reference to the accompanying drawings.

FIGS. 1 to 12 are cross-sectional views illustrating a method of manufacturing a semiconductor device in accordance with exemplary embodiments.

Referring to FIG. 1, a resistive memory layer 110 may be, formed on an upper surface of a semiconductor substrate 100. The resistive memory layer 110 may include a phase-changeable layer. The phase-changeable layer may include chalcogenide (GST) including germanium, antimony and tellurium. The semiconductor substrate 100 may include an access device and a lower electrode (not illustrated). A first conductive layer 115 may be formed on an upper surface of the resistive memory layer 110. The first conductive layer 115 may have a thickness ranging from about 20 Å to about 40 Å. The first conductive layer 115 may include one or more of W, Cu, TIN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, TaON, etc.

Figure 2:
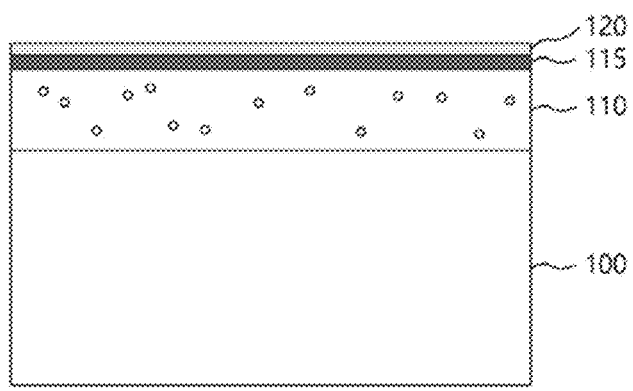

Referring to FIG. 2, a carbon-containing layer 120 may be formed on an upper surface of the first conductive layer 115. The carbon-containing layer 120 may include a pure carbon layer, a carbon compound layer, etc. The carbon-containing layer 120 may be formed by a physical vapor deposition (PVD) process, a chemical vapor deposition (CVD) process, an atomic layer deposition (ALD) process, etc. Alternatively, the carbon-containing layer 120 may include an undoped carbon layer, a carbon layer doped with N type impurities or P type impurities, etc. The carbon-containing layer 120 may have an etching selectivity with respect to conductive layers formed later. The carbon-containing layer 120 may be used as an etch stop layer for etching the conductive layers. The carbon-containing layer 120 may have a thickness ranging from about 70 Å to about 80 Å.

The first conductive layer 115 interposed between the carbon-containing layer 120 and the resistive memory layer 110 may secure resistance characteristics of the resistive memory layer 110. Particularly, when the resistive memory layer 110 makes direct contact with the carbon-containing layer 120, carbons in the carbon-containing layer 120 may migrate to the resistive memory layer 110 so that the resistive memory layer 110 may have non-uniform interfacial contact resistance. Further, the direct contact may cause changes in concentrations and thus damage of resistance uniformity of the resistive memory layer 110. Therefore, in order to maintain characteristics of the resistive memory layer 110, the first conductive layer 115 may be interposed between the carbon-containing layer 120 and the resistive memory layer 110.

Further, the first conductive layer 115 may be thick enough to prevent etching ions or carbon from penetrating into the resistive memory layer 110.

Figure 3:
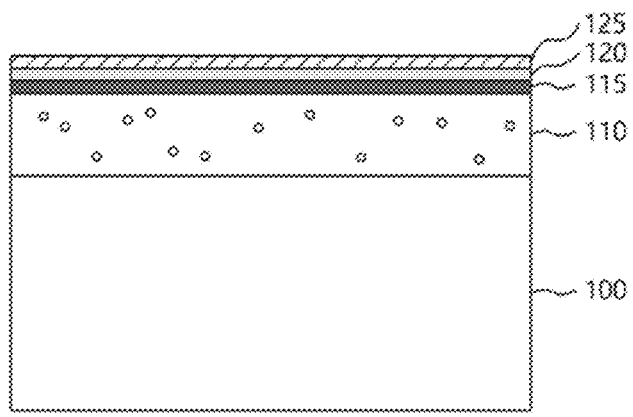

Referring to FIG. 3, a second conductive layer 125 may be formed on an upper surface of the carbon-containing layer 120. The second conductive layer 125 may include TiN. The second conductive layer 125 may have a thickness ranging from about 50 Å to about 70 Å.

Figure 4:
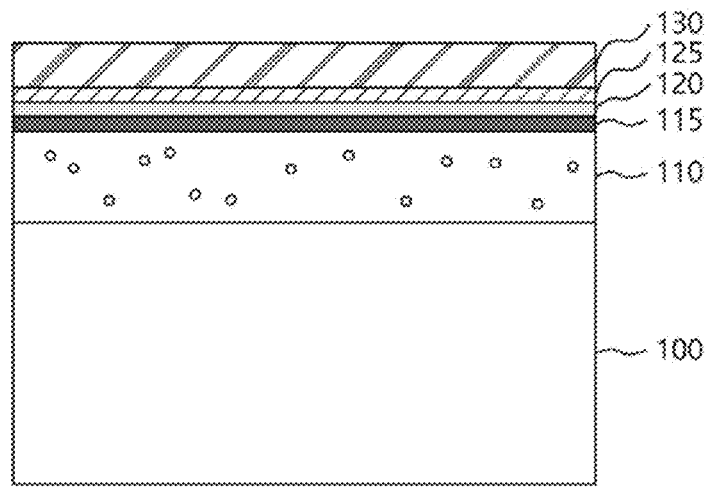

Referring to FIG. 4, a third conductive layer 130 may be formed as a main conductive layer on an upper surface of the second conductive layer 125. The third conductive layer 130 may have a thickness greater than the thickness of the first and second conductive layers 115 and 125. The third conductive layer 130 may have a thickness ranging from about 300 Å to about 400 Å. The first conductive layer 115 may include one or more of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, TaON, etc.

The second conductive layer 125 including TiN may function as an adhesive layer between the carbon-containing layer 120 and the third conductive layer 130.

Figure 5:
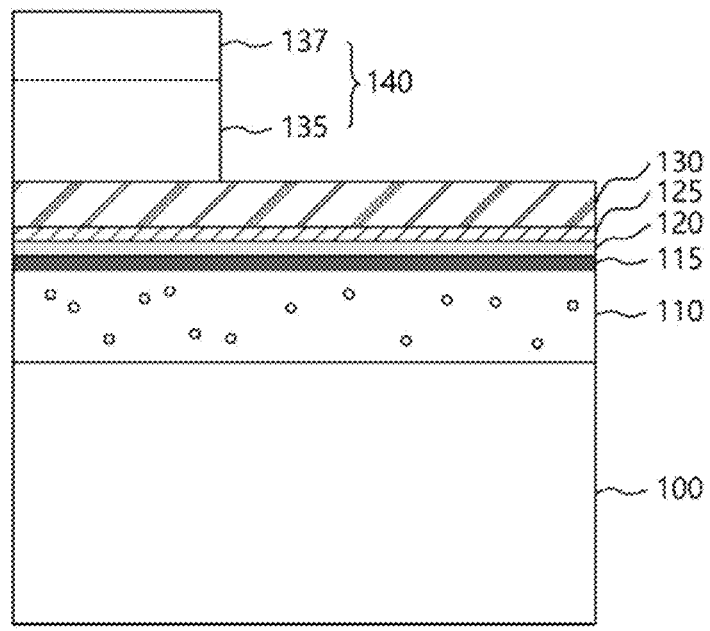

Referring to FIG. 5, a hard mask Dyer may be formed on an upper surface of the third conductive layer 130. The hard mask layer may be patterned to form a hard mask pattern 140. The hard mask pattern 140 may include a silicon nitride layer, a silicon oxide layer, a silicon nitride/silicon oxide layer, etc. In this exemplary embodiment, the hard mask pattern 140 may include the silicon nitride layer 135 and the silicon oxide layer 137 sequentially stacked.

Figure 6:
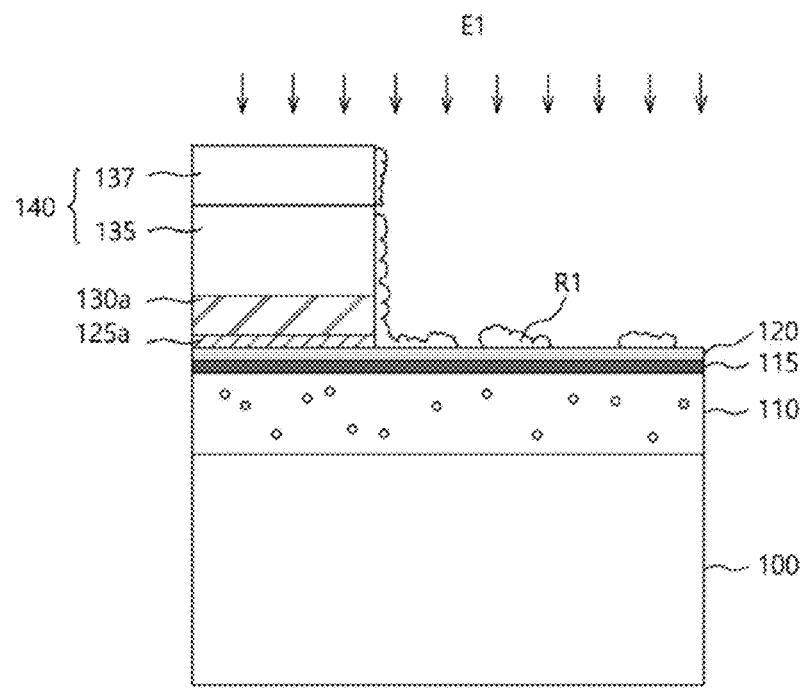

Referring to FIG. 6, the third conductive layer 130 and the second conductive layer 125 may be etched by an etching process E1 using the hard mask pattern 140 as an etch mask to form a third conductive layer pattern 130a and a second conductive layer pattern 125a. The etching process E1 may include an anisotropic dry etching process. An etching gas for etching the third conductive layer 130 and the second conductive layer 125 may include Cl group and/or F group. For example, the third conductive layer 130 may be anisotropicaliy dry-etched using an $NF_3/Cl_3/N_2/O_2$ gas. The second conductive layer 125 may be anisotropically dry-etched using a $CH_3/CF_4/BCl_3$ gas.

The etching process E1 for etching the third conductive layer 130 and the second conductive layer 125 may use an exposed point of the carbon-containing layer 120 as an etching stop-point. The etch thickness of a single etching process may be controlled by using the carbon-containing layer 120 as the etch stop layer to improve etch distribution, i.e., etch uniformity. The etching gas including the Cl group and/or the F group may undesirably react with ingredients in an upper surface and a side surface of the hard mask pattern 140, a side surface of the third conductive layer 130, a side surface of the second conductive layer 125 and a surface of the carbon-containing layer 120 to generate byproducts R1.

Figure 7:
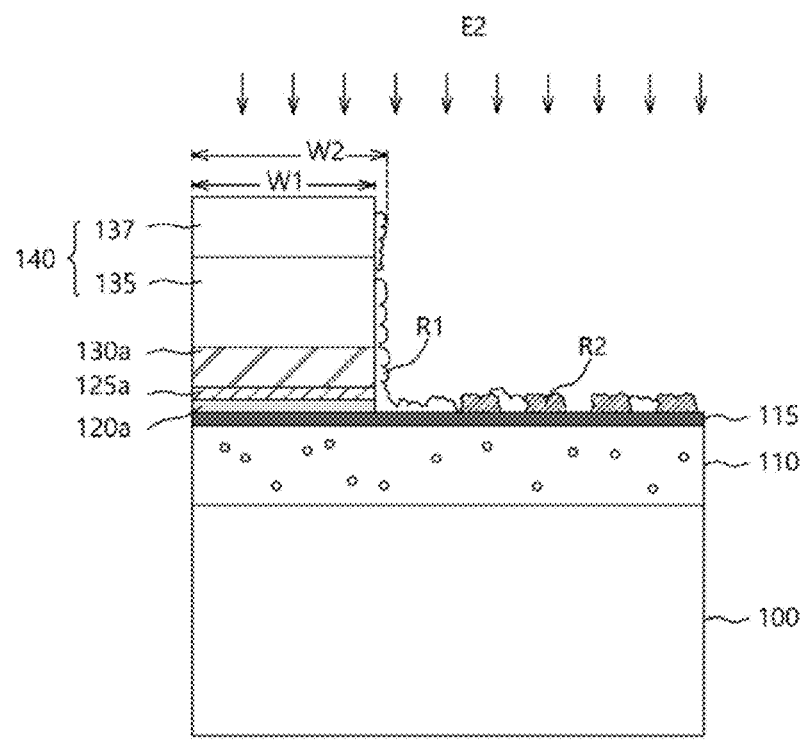

Referring to FIG. 7, the carbon-containing layer 120 may be anisotropically etched using the hard mask pattern 140, the third conductive layer pattern 130a and the second conductive layer pattern 125a as etch masks to form a carbon-containing layer pattern 120a. The carbon-containing layer 120 may be etched using an etching gas including $N_2/H_2$, $N_2/O_2/Ar$, etc. The etching gas including the $N_2/H_2$ or $N_2/O_2/Ar$ may undesirably react with ingredients in the upper surface and the side surface of the hard mask pattern 140, the side surface of the third conductive layer 130, the side surface of the second conductive layer 125, the surface of the carbon-containing layer 120 and the upper surface of the first conductive layer 115 to generate byproducts R2.

The byproducts R1 and R2 may include polymers. The remaining byproducts R1 and R2 may function as a mask pattern such as the hard mask pattern 140. Thus, line widths of the hard mask pattern 140, the third conductive layer pattern 130a, the second conductive layer pattern 125a and the carbon-containing layer pattern 120a for defining memory cells may be substantially extended due to the byproducts R1 and R2 on the hard mask pattern 140, the third conductive layer pattern 130a, the second conductive layer pattern 125a and the carbon-containing layer pattern 120a. This byproducts R1 and R2 may cause non-uniformity of size in the memory and thus differences between operational characteristics of the memory cells. In FIG. 7, indicator 'W1' represents a line width of the hard mask pattern 140. Indicator 'W2' represents a line width of an actual mask pattern for patterning the first conductive layer 115 and the resistive memory layer 110 due to the byproducts R1 and R2 on the hard mask pattern 140.

Figure 8:
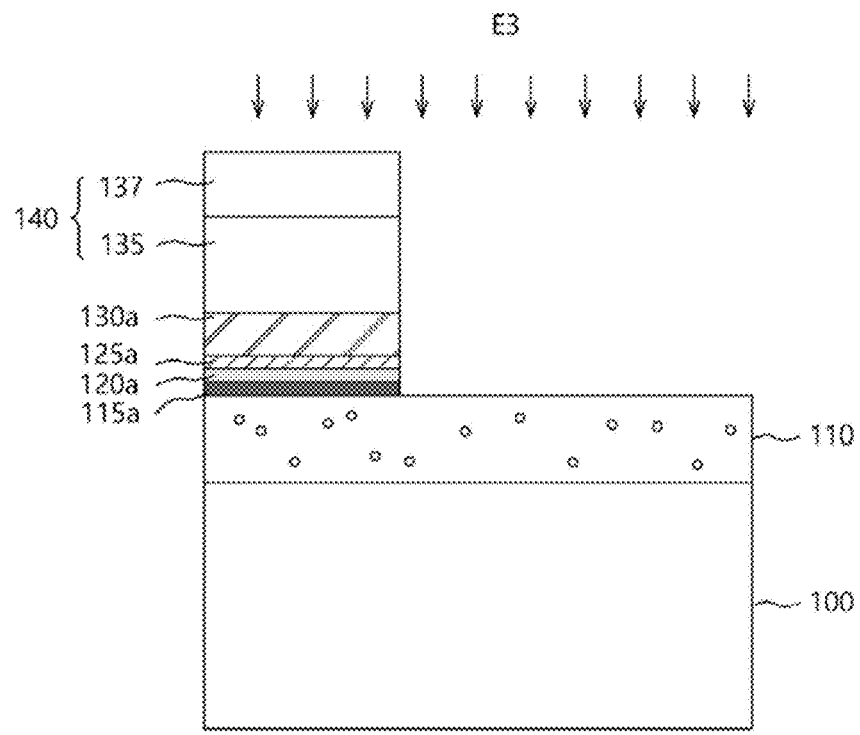

Referring to FIG. 8, a removing process E3 may performed on an exposed portion of the first conductive layer 115 and the byproducts R1 and R2 to form a first conductive layer pattern 115a.

Figure 9:
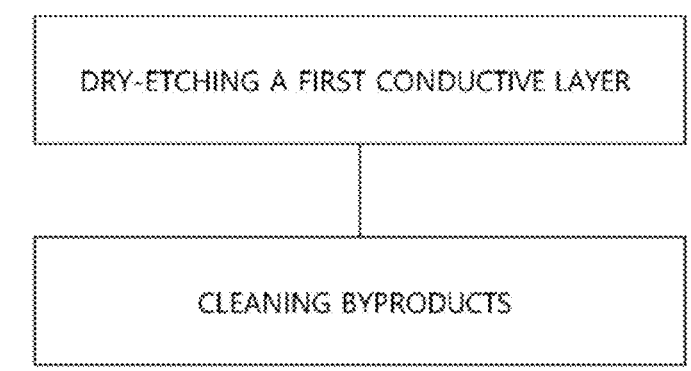

Referring to FIG. 9, the removing process E3 may include a process for dry-etching the first conductive layer 115 and a process for cleaning the byproducts R1 and R2.

The first conductive layer 115 may be dry-etched using an $NF_3/Ar$ gas. Because the first conductive layer 115 may be significantly thinner than the thickness of the third conductive layer 115, generation of the byproducts R1 and R2 may be suppressed in the short etching process. Further, the dry etching process may partially remove the byproducts R1 and R2.

In order to completely remove the byproducts R1 and R2, a cleaning process may be additionally performed. The cleaning process may use a buffered oxide etcher (BOE) chemical solution having pH ranging from about 6.5 to about 7.0, or a chemical solution including about 0.1 percent to about 5 percent by weight of an organic acid and having pH ranging from about 3 to about 7.0. The organic acid may include citric acid, alanine acid, malic acid, malonic acid, etc.

Figure 10:
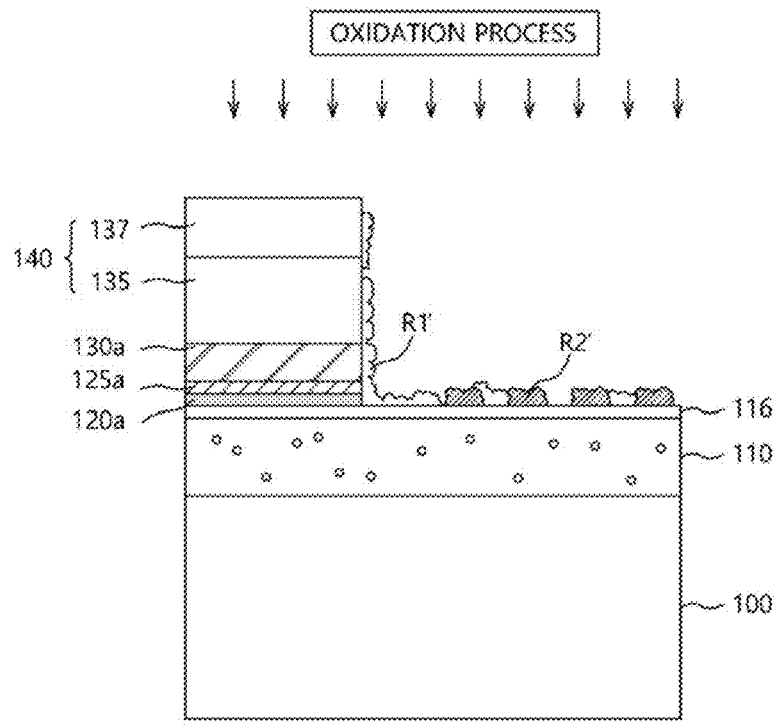
Figure 11:
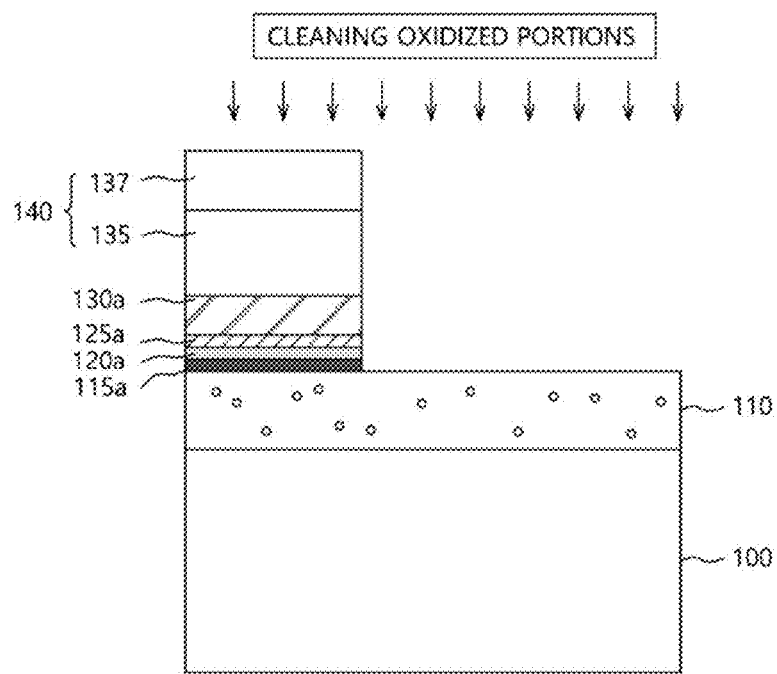

FIGS. 10 and 11 are cross-sectional views illustrating a method of removing a first conductive layer in accordance with exemplary embodiments.

Referring to FIGS. 10 and 11, the removing process E3 for removing the first conductive layer 115 and the byproducts R1 and R2 may include oxidizing the exposed portion of the first conductive layer 115 and the byproducts R1 and R2, and wet-etching the oxidized first conductive layer 115 and the oxidized byproducts R1 and R2.

For example, the exposed portion of the first conductive layer 115 may be oxidized using ozone water. This oxidation process may oxidize the byproducts R1 and R2. In FIGS. 10 and 11, a reference numeral 116 may indicate the oxidized first conductive layer and reference numerals R1' and R2' may indicate the oxidized byproducts. Alternatively, the first conductive layer 115 and the byproducts R1 and R2 may be oxidized by a dry oxidation process using oxygen plasma.

The wet etching process may use a buffered oxide etcher (BOE) chemical solution having a pH ranging from about 6.5 to about 7.0 or an $NH_4OH$ chemical solution having pH ranging from about 10 to about 12. The wet etching process may selectively remove the oxidized first conductive layer 116 and the oxidized byproducts R1' and R2' without damaging the resistive memory layer 110. When the hard mask pattern 140 includes the silicon oxide layer 137, the silicon oxide layer 137 may also be removed by the wet-etching process.

Figure 12:
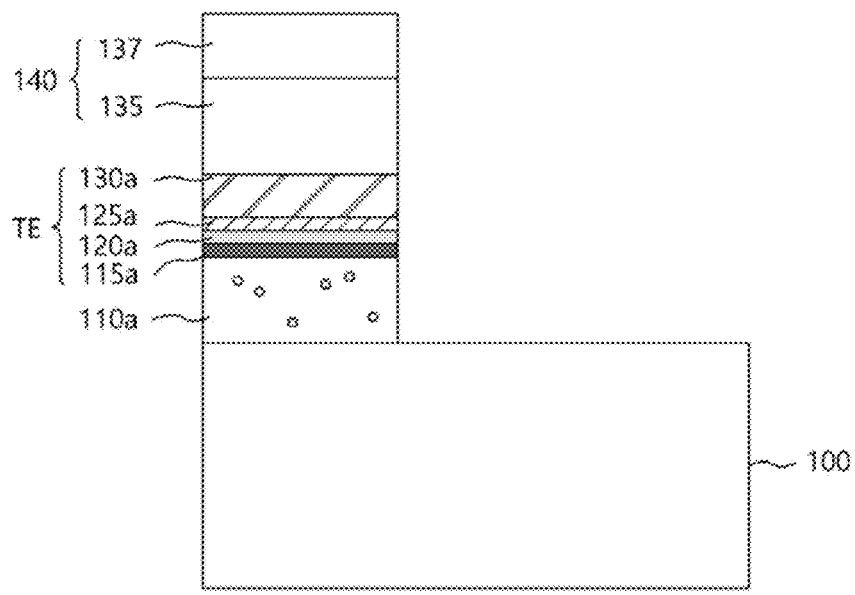

Referring to FIG. 12, the resistive memory layer 110 may be etched using the hard mask pattern 140 and the first to third conductive layer patterns 115a, 125a and 130a using an etch mask.

The resistive memory layer 110 may be anisotropically etched using a mixed gas of a $CH_4/H_2$ gas and a $CH_4/Ar$ gas. Because the byproducts R1 and R2 do not remain on the side surfaces of the hard mask pattern 140 and the first to third conductive layer patterns 115a, 125a and 135a by the cleaning process, the patterned resistive memory layer 110 may be provided with a desired shape of the memory cell. In FIG. 12, a reference numeral 110a indicates a resistive memory layer pattern. The size or the line width of the memory cell may correspond to a size of the resistive memory layer pattern 110a.

Figure 14:
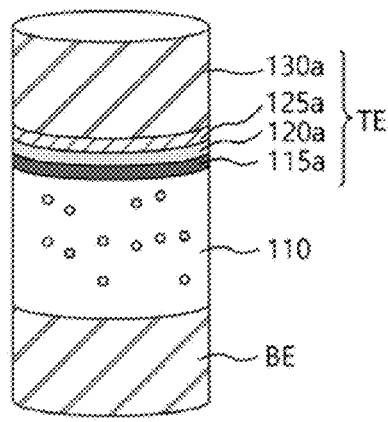

Referring to FIGS. 12 and 14, the first conductive layer pattern 115a, the carbon-containing layer pattern 120a, the second conductive layer pattern 125a and the third conductive layer pattern 130a may correspond to an upper electrode TE for transmitting electric signals to the resistive memory layer pattern 110a.

Figure 13:
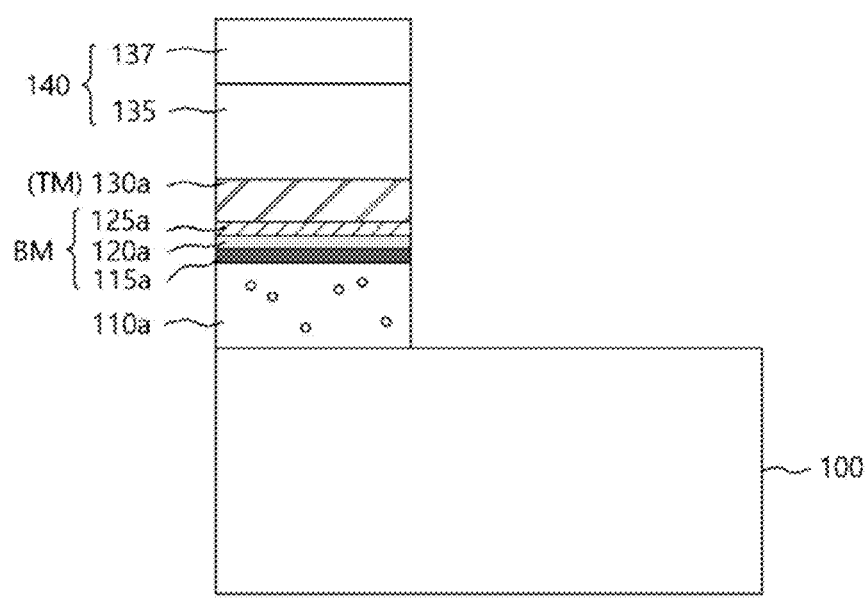
Figure 15:
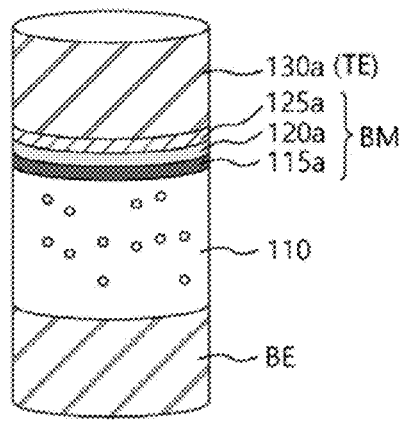

From another point of view, referring to FIGS. 13 and 15, the first conductive layer pattern 115a, the carbon-containing layer pattern 120a and the second conductive layer pattern 125a may correspond to a barrier layer BM interposed between the upper electrode (TE) 130a and the resistive memory layer pattern 110a to define the resistive memory layer pattern 110a.

That is, because the first conductive layer pattern 115a, the carbon-containing layer pattern 120a and the second conductive layer pattern 125a may be electrically connected to the third conductive layer pattern 130a configured to directly or indirectly make contact with a bit line as shown in FIGS. 12 and 14, the first conductive layer pattern 115a, the carbon-containing layer pattern 120a and the second conductive layer pattern 125a may function as to the upper electrode TE.

Alternatively, because the first conductive layer pattern 115a, the carbon-containing layer pattern 120a and the second conductive layer pattern 125a interposed between the resistive memory layer pattern 110a and the third conductive layer pattern 130a as the main conductive layer may be used as the etch stop layer and the adhesive layer as shown in FIGS. 13 and 15, the first conductive layer pattern 115a, the carbon-containing layer pattern 120a and the second conductive layer pattern 125a may function as the barrier layer BM.

In FIGS. 14 and 15, a reference numeral 'BE' indicates a lower electrode for changing a resistance of the resistive memory layer pattern 110a together with the upper electrode TE.

Figure 16:
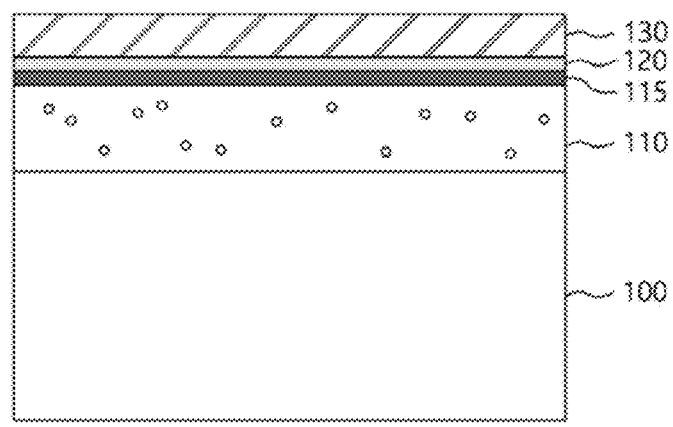

In exemplary embodiments, the second conductive layer 125 including TiN may be interposed between the carbon-containing layer 120 and the third conductive layer 130. Alternatively, as shown in FIG. 16, the third conductive layer 130 may be directly formed on the carbon-containing layer 120 without the second conductive layer 125.

According to exemplary embodiments, the first conductive layer as the interfacial conductive layer for removing the byproducts, the carbon-containing layer as the etch stop layer, and/or the second conductive layer as the adhesive layer may be interposed between the third conductive layer and the resistive memory layer as the upper electrode. The first conductive layer, the carbon-containing layer and the second conductive layer may be patterned and cleaned. Thus, the upper electrode and the resistive memory layer pattern may be formed without the byproducts.

Further, an etching distribution in the etching process for forming the memory cell may be improved by using the etch stop layer.

Furthermore, the conductive layer may be interposed between the etch stop layer and the resistive memory layer to suppress property changes of the resistive memory layer.

Figure 17:
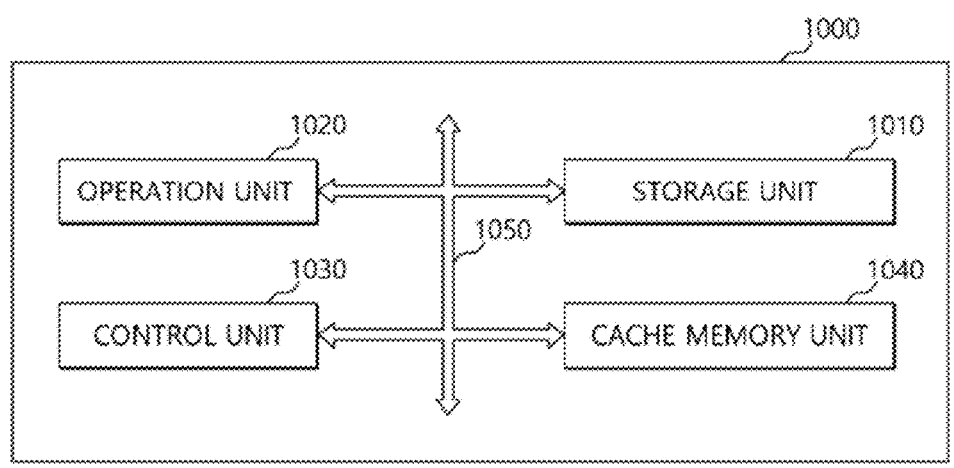

As illustrated in FIG. 17, a microprocessor 1000 to which the semiconductor device according to the embodiment is applied may control and adjust a series of processes, which receive data from various external apparatuses, process the data, and transmit processing results to the external apparatuses. The microprocessor 1000 may include a storage unit 1010, an operation unit 1020, and a control unit 1030. The microprocessor 1000 may be a variety of processing apparatuses, such as a micro processing unit (MPU), a central processing unit (CPU), a graphic processing unit (GPU), a digital signal processor (DSP), or an application processor (AP).

The storage unit 1010 may be a processor register or a register, and the storage unit may be a unit that stores data in the microprocessor 1000 and include a data register, an address register, and a floating point register. The storage unit 1010 may include various registers other than the above-described registers. The storage unit 1010 may temporarily store data to be operated on in the operation unit 1020, resulting data that was processed in the operation unit 1020, and an address in which the data to be operated on is stored.

The storage unit 1010 may include one of the semiconductor devices according to the embodiments of the present invention. The storage unit 1010 including the semiconductor device according to the above-described embodiments may use a tunneling transistor, in which a semiconductor material layer having a low band gap is inserted into or around a source, as a switching device.

The operation unit 1020 may perform an operation in the microprocessor 1000, and perform a variety of four fundamental rules of arithmetic operation or operations, depending on a decryption result of a command in the control unit 1030. The operation unit 1020 may include one or more arithmetic and logic units (ALUs).

The control unit 1030 may receive a signal from the storage unit 1010, the operation unit 1020, or an external apparatus of the microprocessor 1000, may perform extraction or decryption of a command, or input or output control, and may execute a process in a program form.

The microprocessor 1000 according to the embodiments of the present invention may further include a cache memory unit 1040 that may temporarily store data input from an external apparatus or data to be output to an external apparatus, other than the storage unit 1010. The cache memory unit 1040 may exchange data with the storage unit 1010, the operation unit 1020, and the control unit 1030 through a bus interface 1050.

Figure 18:
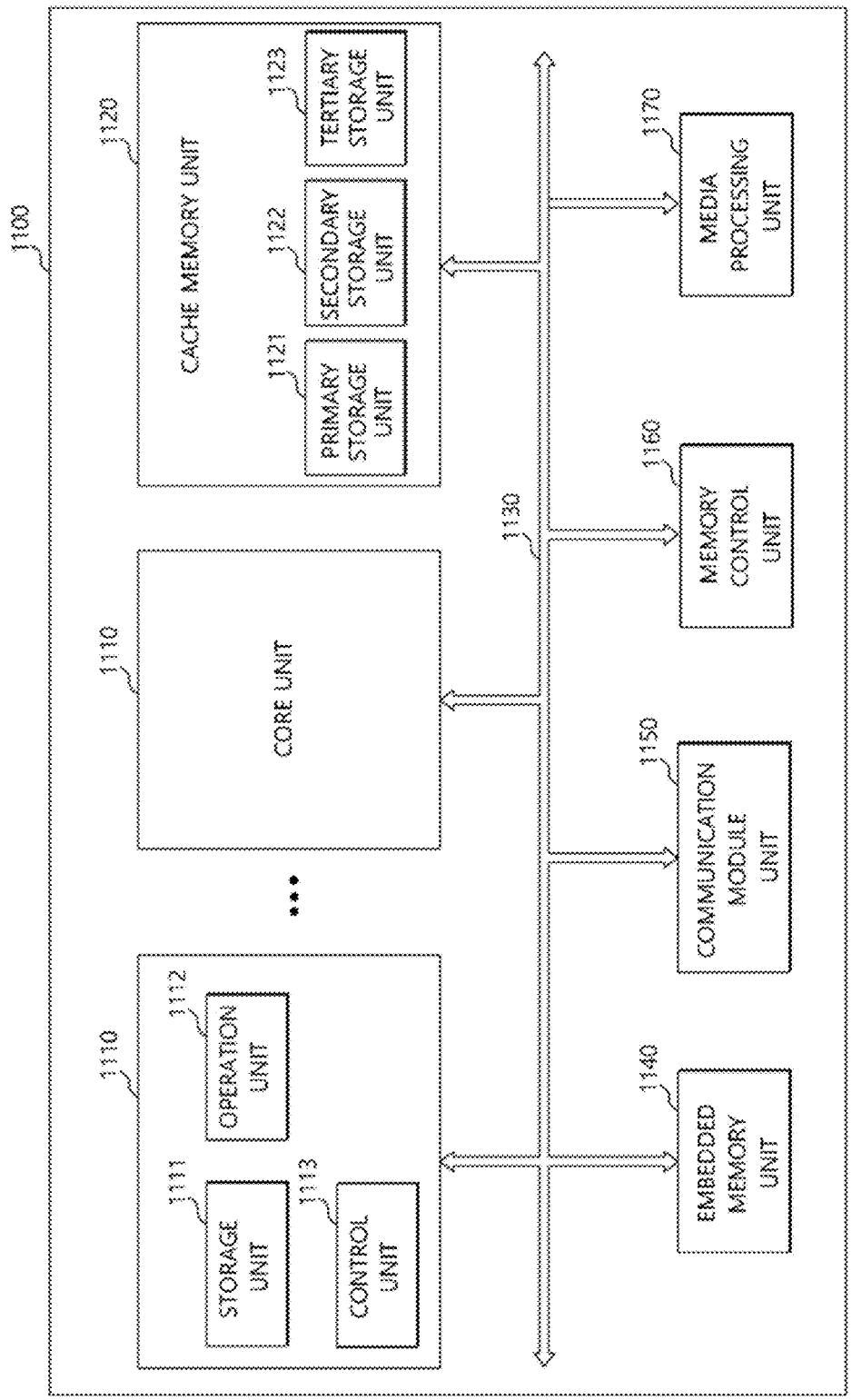

As illustrated in FIG. 18, a processor 1100 in which the semiconductor device according to the embodiment of the present invention is applied may include various functions to implement performance improvement and multifunction, in addition to the functions of the microprocessor that may control and adjust a series of processes, which receive data from various external apparatuses, process the data, and transmit processing results to the external apparatuses. The processor 1100 may include a core unit 1110, a cache memory unit 1120, and a bus interface 1130. The core unit 1110 in an embodiment according to the present invention may perform arithmetic and logic operations on data input from an external apparatus, and include a storage unit 1111, an operation unit 1112, and a control unit 1113. The processor 1100 may be a variety of system on chips (SoCs) such as a multi core processor (MCP), a graphics processing unit (GPU), or an application processor (AP).

The storage unit 1111 may be a processor register or a register, and the storage unit 1111 may be a unit that may store data in the processor 1100 and include a data register, an address register, and a floating point register. The storage unit 1111 may include various registers other than the above-described registers. The storage unit 1111 may temporarily store data to be operated on in the operation unit 1112, resulting data that was processed in the operation unit 1112, and an address in which the data to be operated on is stored. The operation unit 1112 may be a unit that may perform an operation in the processor 1100, and perform a variety of four fundamental rules of an arithmetic operation or logic operations depending on a decryption result of a command in the control unit 1113. The operation unit 1112 may include one or more arithmetic and logic units (ALUs). The control unit 1113 receives a signal from the storage unit 1111, the operation unit 1112, or an external apparatus of the processor 1100, performs extraction or decryption of a command, or input or output control, and executes a process in a program form.

The cache memory unit 1120 may temporarily store data to supplement the data processing rate of a low speed external apparatus unlike the high speed core unit 1110, The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123, If necessary, the cache memory unit 1120 may include more storage units. That is, the number of storage units included in the cache memory unit 1120 may be changed according to design. Processing rates of data storage and discrimination of the primary, secondary, and tertiary storage units 1121, 1122, and 1123 may be the same or different. When the processing rates of the storage units are different, the processing rate of the primary storage unit is the greatest. One or more of the primary storage unit 1121, the secondary storage unit 1122, and the tertiary storage unit 1123 in the cache memory unit 1200 may include one of the semiconductor devices according to the embodiments of the present invention. The cache memory unit 1120 including the semiconductor device according to the above-described embodiments may use a tunneling transistor, in which a semiconductor material layer having a low band gap is inserted into or around a source, as a switching device. Further, FIG. 18 has illustrated that all the primary, secondary, tertiary storage units 1121, 1122, and 1123 are disposed in the cache memory unit 1120. However, all the primary, secondary, and tertiary storage units 1121, 1122, and 1123 in the cache memory unit 1120 may be disposed outside the core unit 1110, and may supplement the difference between the processing rates of the core unit 1110 and an external apparatus. Further, the primary storage unit 1121 of the cache memory unit 1120 may be located in the core unit 1110, and the secondary storage unit 1122 and the tertiary storage unit 1123 may be located outside the core unit 1110 to further compensate for the processing rate.

The bus interface 1130 may couple the core unit 1110 and the cache memory unit 1120 to efficiently transmit data.

The processor 1100 according to the embodiments may include a plurality of core units 1110, and the core units 1110 may share the cache memory unit 1120. The core units 1110 and the cache memory unit 1120 may be coupled through the bus interface 1130. The core units 1110 may have the same configuration as the above-described core unit 1110. When the core units 1110 are provided, the primary storage unit 1121 of the cache memory unit 1120 may be disposed in each of the core units 1110 corresponding to the number of core units 1110, and one secondary storage unit 1122 and one tertiary storage unit 1123 may be disposed outside the core units 1110 so that the core units share the secondary and tertiary storage units through the bus interface 1130. The processing rate of the primary storage unit 1121 may be greater than those of the secondary and tertiary storage units 1122 and 1123.

The processor 1100 according to the embodiments may further include an embedded memory unit 1140 that may store data, a communication module unit 1150 that may transmit and receive data to and from an external apparatus in a wired or a wireless manner, a memory control unit 1160 that may drive an external storage device, and a media processing unit 1170 that may process data processed in the processor 1100 or data input from an external input device and may output a processing result to an external interface device. The processor may further include a plurality of modules other than the above-described components. The additional modules may transmit data to and receive data from the core unit 1110 and the cache memory unit 1120, and transmit and receive data therebetween, through the bus interface 1130.

The embedded memory unit 1140 may include volatile memory as well as nonvolatile memory. The volatile memory may include a dynamic random access memory (DRAM), a mobile DRAM, a static RAM (SRAM), or the like, and the nonvolatile memory may include a read only memory (ROM), a NOR flash memory, a NAND flash memory, a phase-change RAM (PCRAM), a resistive RAM (RRAM), a spin transfer torque RAM (STTRAM), a magnetic RAM (MRAM), or the like. The semiconductor device according to the embodiments may also be applied to the embedded memory unit 1140.

The communication module unit 1150 may include a module coupled to a wired network and a module coupled to a wireless network. The wired network module may include a local area network (LAN), a universal serial bus (USB), Ethernet, power line communication (PLC), or the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NEC), Wireless Broadband Internet (Wibro), High Speed Downlink Packet Access (HSDPA), Wideband CDMA (WCDMA), Ultra WideBand (UWB), or the like.

The memory control unit 1160 may manage data transmitted between the processor 1100 and an external storage apparatus that may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA) a USB, a secure digital (SD) card, a mini secure digital (mSD) card, a micro SD card, a secure digital high capacity (SDHC) card, a memory stick card, a smart media (SM) card, a multimedia card (MMC), an embedded MMC (eMMC), a compact flash (CF) card, or the like.

The media processing unit 1170 may process data processed in the processor 1100 or data input from an external input device, and may output a processing result to an external interface device so that the processing result may be transferred in video, sound, or in other ways. The media processing unit 1170 may include a GPU, a DSP, HD audio, a high definition multimedia interface (HDMI) controller, or the like.

Figure 19:
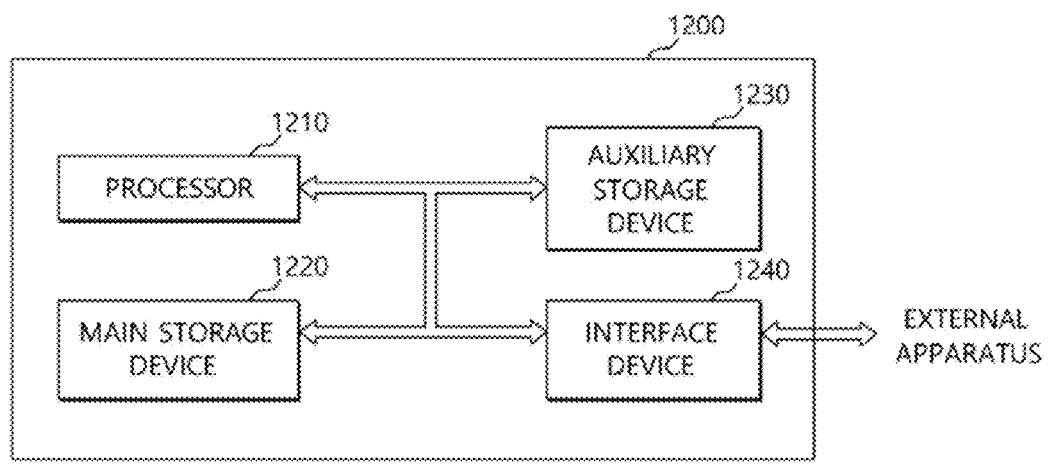

As illustrated in FIG. 19, a system 1200 in which the semiconductor device according to an embodiment of the present invention is applied may be a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiments may be a variety of electronic systems that may operate using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing such as an operation and comparison of data stored in the system, and may include a MPU, a CPU, a single/multi core processor, a GPU, an AP, a DSP, or the like.

The main storage device 1220 is a storage location that may receive a program or data from the auxiliary storage device 1230 and execute the program or the data. The main storage device 1220 retains the stored content even when powered off, and may include a semiconductor device according to the above-described embodiments. The main storage device 1220 may use a tunneling transistor, in which a semiconductor material layer having a low band gap is inserted into or around a source, as a switching device.

The main storage device 1220 according to the embodiment may further include an SRAM or a DRAM of a volatile memory type in which all contents are erased in power off. Alternatively, the main storage device 1220 may not include a semiconductor device according to the embodiments but may include an SRAM or a DRAM of a volatile memory type in which all contents are erased when powered off.

The auxiliary storage device 1230 may store a program code or data. The auxiliary storage device 1230 may have a lower data processing rate than the main storage device 1220, but may store large amounts of data and include a semiconductor device according to the above-described embodiments. The auxiliary storage unit 1230 may also use a tunneling transistor, in which a semiconductor material layer having a low band gap is inserted into or around a source, as a switching device.

The area of the auxiliary storage device 1230 according to the embodiments of the present invention may be reduced, so that a size of the system 1200 is reduced and portability of the system 1200 is increased. Further, the auxiliary storage device 1230 may further include a data storage system (not shown), such as a magnetic tape or a magnetic disc, a laser disc using light, a magneto-optical disc using magnetism and light, an SSD, a USB memory, a SD card, a mSD card, a micro SD card, a SDHC card, a memory stick card, a SM card, a MMC, an eMMC, or a CF card. Alternatively, the auxiliary storage device 1230 may not include a semiconductor device according to the above-described embodiments but may include a data storage system (not shown), such as a magnetic tape or a magnetic disc using a magnetism, a laser disc using light, a magneto-optical disc using magnetism and light, an SSD, a USB memory, a SD card, a mSD card, a micro SD card, a SDHC card, a memory stick card, a SM card, a MMC, an eMMC, or a CF card.

The interface device 1240 may exchange a command and data of an external apparatus with the system of the embodiment, and may be a keypad, a keyboard, a mouse, a speaker, a microphone, a display, a variety of Human Interface Devices (HIDs), or a communication device. The communication device may include multiple modules such as a module coupled to a wired network and a module coupled to a wireless network. The wired network module may include a LAN, a USB, Ethernet, PLC, or the like, and the wireless network module may include IrDA, CDMA, TDMA, FDMA, a wireless LAN, Zigbee, a USN, Bluetooth, RED, LTE, NFC, Wibro, HSDPA, WCDMA, UWB, or the like.

While various embodiments have been described above, it will be understood to those skilled in the art that the embodiments described are examples only. Accordingly, the circuit and method described herein should not be limited based on the described embodiments.

What is claimed is:

1. A method of manufacturing a semiconductor device, the method comprising:

sequentially forming an interfacial conductive layer with a conductivity and an etch stop layer on a resistive memory layer;

forming a main conductive layer on the etch stop layer;

exposing a portion of the etch stop layer by patterning the main conductive layer;

exposing a portion of the interfacial conductive layer by patterning the portion of the etch stop layer;

forming an upper electrode structure by patterning the portion of the interfacial conductive layer;

cleaning a surface of the upper electrode structure and an exposed surface of the resistive memory layer; and patterning the resistive memory layer using the upper electrode structure as an etch mask, wherein the patterning of the portion of the interfacial conductive layer comprises oxidizing the exposed portion of the interfacial conductive layer, wherein the cleaning of the surface of the upper electrode structure and the surface of the resistive memory layer removes the oxidized portion of the interfacial conductive layer, and wherein the cleaning of the surface of the upper electrode structure and the surface of the resistive memory layer removes byproducts generated in the patterning of the main conductive layer, the patterning of the portion of the etch stop layer and the patterning of the portion of the interfacial conductive layer.

2. The method of claim 1, wherein one or more of the interfacial conductive layer and the main conductive layer comprises one or more selected from a group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON and TaON.

3. The method of claim 2, wherein the patterning of the main conductive layer comprises dry-etching the main conductive layer using an etching gas including Cl and/or F.

4. The method of claim 1, wherein the etch stop layer comprises carbon.

5. The method of claim 4, wherein the patterning of the portion of the etch stop layer comprises dry-etching the portion of the etch stop layer using an etching gas including $N_2/H_2$ and/or $N_2/O_2/Ar$.

6. The method of claim 1, wherein the cleaning of the surface of the upper electrode structure and the surface of the resistive memory layer is performed using a buffered oxide etcher (BOE) chemical having a pH of about 6.5 to about 7.0 and/or a chemical including about 0.1% to about 5% by weight of an organic acid and having pH of about 3 to about 7.

7. The method of claim 1, wherein the oxidizing of the exposed portion of the interfacial conductive layer comprises wet-oxidizing the interfacial conductive layer using ozone water.

8. The method of claim 1, wherein the oxidizing of the exposed portion of the interfacial conductive layer comprises dry-oxidizing the interfacial conductive layer using plasma.

9. The method of claim 1, wherein the cleaning of the surface of the upper electrode structure and the surface of the resistive memory layer removes the oxidized portion of the interfacial conductive layer and the byproducts through a buffered oxide etcher (BOE) chemical having a pH of about 6.5 to about 7.0 and/or an $NH_4$ chemical having pH of about 10 to about 12.

10. The method of claim 1,
further comprising forming a conductive layer as an adhesive layer between the etch stop layer and the main conductive layer,
wherein the conductive layer is patterned simultaneously with the main conductive layer.

11. A method of manufacturing a semiconductor device, the method comprising:
forming a resistive memory layer on a lower electrode;
forming a barrier layer, which includes an interfacial conductive layer and an etch stop layer, on the resistive memory layer;
forming a conductive layer on the barrier layer;
forming an upper electrode by patterning the conductive layer until the etch stop layer is exposed;
forming an etch stop layer pattern by patterning the etch stop layer using the upper electrode as an etch mask;
forming a barrier layer pattern including an interfacial conductive layer pattern and the etch stop layer pattern by removing an exposed portion of the interfacial conductive layer; and
forming a resistive memory layer pattern by etching the resistive memory layer using the upper electrode and the barrier layer pattern as etch masks,
wherein the removing of the exposed portion of the interfacial conductive layer comprises:
oxidizing the exposed portion of the interfacial conductive layer; and
cleaning the oxidized portion of the interfacial conductive layer using a chemical.

12. The method of claim 11, wherein one or more of the interfacial conductive layer and the conductive layer comprises one or more selected from a group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON and TaON.

13. The method of claim 12, wherein the patterning of the conductive layer comprises dry-etching the conductive layer using an etching gas including Cl and/or F.

14. The method of claim 11, wherein the etch stop layer comprises carbon.

15. The method of claim 14, wherein the patterning of the etch stop layer comprises dry-etching the etch stop layer using an etching gas including $N_2/H_2$ and/or $N_2/O_2/Ar$.

16. The method of claim 11, wherein the oxidizing of the exposed portion of the interfacial conductive layer comprises wet-oxidizing the interfacial conductive layer using ozone water.

17. The method of claim 11, wherein the oxidizing of the exposed portion of the interfacial conductive layer comprises dry-oxidizing the interfacial conductive layer using plasma.

18. The method of claim 11,
wherein the chemical comprises a buffered oxide etcher (BOE) chemical having a pH of about 6.5 to about 7.0 and/or an $NH_4$ chemical having a pH of about 10 to about 12, and
wherein the cleaning the oxidized portion of the interfacial conductive layer comprises removing byproducts.

19. The method of claim 11,
wherein forming the barrier layer comprises forming a conductive adhesive layer on the etch stop layer, and
wherein the conductive adhesive layer is simultaneously patterned when the conductive layer is patterned.

20. A method of manufacturing a semiconductor device, the method comprising:
providing a resistive memory layer;
sequentially forming a carbon blocking layer with a conductivity, a carbon-containing layer and an adhesion layer on the resistive memory layer;
forming an upper electrode layer on the adhesion layer;
etching the upper electrode layer and the adhesion layer to expose the carbon-containing layer, wherein a first by-product is generated by the etching the upper electrode layer;
etching the carbon-containing layer to expose the carbon blocking layer, wherein a second by-product is generated by the etching the carbon-containing layer; and
removing the exposed carbon blocking layer and the first and second by-products, to form an upper electrode structure,
wherein the upper electrode layer and the carbon blocking layer include a same metal material in common.

21. The method of claim 20, the upper electrode layer and the carbon blocking layer include W (tungsten) material in common.

22. The method of claim 20, wherein the removing the exposed carbon blocking layer comprises:
dry-etching the exposed carbon blocking layer using an etching gas including $NF_3$ gas and Ar gas; and
cleaning the first and second by-products using a buffered oxide etcher (BOE) chemical having a pH of about 6.5 to about 7.0 and/or a chemical including about 0.1% to about 5% by weight of an organic acid and having pH of about 3 to about 7.

* * * * *